(12) United States Patent
Loewenstein (10) Patent No.: US 10,423,482 B2
(45) Date of Patent: Sep. 24, 2019

(54) ROBUST PIN-CORRECTING ERROR-CORRECTING CODE

(71) Applicant: Oracle International Corporation, Redwood Shores, CA (US)

(72) Inventor: Paul N. Loewenstein, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/458,408

(22) Filed: Mar. 14, 2017

(65) Prior Publication Data

US 2018/0115327 A1   Apr. 26, 2018

Related U.S. Application Data

(60) Provisional application No. 62/412,173, filed on Oct. 24, 2016.

(51) Int. Cl.
*G11C 29/00* (2006.01)
*G06F 11/10* (2006.01)
(Continued)

(52) U.S. Cl.
CPC ...... *G06F 11/1044* (2013.01); *G06F 11/1012* (2013.01); *H03M 13/2906* (2013.01); *H03M 13/134* (2013.01); *H03M 13/152* (2013.01)

(58) Field of Classification Search
CPC ............ G06F 11/1012; G06F 11/1044; H03M 13/2906; H03M 13/2927; H03M 13/6516
See application file for complete search history.

(56) References Cited

U.S. PATENT DOCUMENTS

7,620,875 B1 * 11/2009 Nelson ................ G06F 11/1044
714/763
2005/0022065 A1 * 1/2005 Dixon ................... G06F 11/106
714/42
(Continued)

*Primary Examiner* — Guerrier Merant
(74) *Attorney, Agent, or Firm* — Park, Vaughan, Fleming & Dowler LLP (57) ABSTRACT

The disclosed embodiments provide a memory system that provides error detection and correction. Each block of data in the memory system includes an array of bits logically organized into R rows and C columns, including C−M−1 data-bit columns containing data bits, a row check bit column including row-parity bits for each of the R rows in the block, and M inner check bit columns that collectively include MR inner check bits. These inner check bits are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is associated with a different pin in a memory module interface, and wherein the check bits are generated from the data bits to facilitate block-level detection and correction for errors that arise during the transmission. During operation, the system transmits a block of data from the memory. Next, the system uses an error-detection circuit to examine the block of data, and determine whether an error has occurred during the transmission based on the examination.

20 Claims, 3 Drawing Sheets

(51) Int. Cl.
*H03M 13/29* (2006.01)
*H03M 13/13* (2006.01)
*H03M 13/15* (2006.01)

(56) References Cited

U.S. PATENT DOCUMENTS

2010/0287445 A1* 11/2010 Dell ................ G06F 11/1044
  714/763
2011/0289368 A1* 11/2011 Daga ................ G06F 11/1012
  714/711

* cited by examiner

ROBUST PIN-CORRECTING ERROR-CORRECTING CODE

CROSS-REFERENCE TO RELATED APPLICATION

This application claims priority under 35 U.S.C. § 119(e) to U.S. Provisional Application Ser. No. 62/412,173, entitled "Robust Pin-Correcting Error-Correcting Code," by Paul N. Loewenstein, filed on 24 Oct. 2016, the contents of which are incorporated by reference.

BACKGROUND

Field

The disclosed embodiments generally relate to error detection and correction mechanisms in computer systems. More specifically, the disclosed embodiments relate to the design of a robust pin-correcting error-correcting code (ECC) based on Galois fields.

Related Art

Computer systems routinely employ error-detecting and error-correcting codes to detect and correct various data errors which can be caused, for example, by noisy communication channels and unreliable storage media. Some error codes, such as single-error correcting, double-error detecting (SECDED) Hamming codes, can be used to correct single-bit errors and detect double-bit errors. Other codes, which may be based on Galois fields, can be used to correct a special class of multi-bit errors caused by a failure of an entire memory component. For example, see U.S. Pat. No. 7,188,296, entitled "ECC for Component Failures Using Galois Fields," by inventor Robert E. Cypher, filed 30 Oct. 2003 and issued on 7 Mar. 2007 (referred to as "the '296 patent"), which is incorporated herein by reference.

The scheme described in the '296 patent arranges the codeword bits into r rows and c columns, wherein each column corresponds to a memory device (typically c=18 for a ×4 DDR4 dual in-line memory module (DIMM)), and each row corresponds to the bits read or written to each memory device (typically r=32 for a ×4 DDR4 DIMM). By using the scheme of the '296 patent, Galois-field-based single-device correction can be supported up to $c=2^r$. Unfortunately, as the number of columns increases, the robustness of the scheme with respect to errors spanning multiple devices decreases. However, by suitably choosing the polynomial defining the Galois field, the scheme of the '296 patent can be modified to be robust against inter-device errors of up to three bits for the case where c=18 and r=32. (See U.S. Pat. No. 9,160,370, entitled "Single Component Correcting ECC Using a Reducible Polynomial with GF(2) Coefficients," by inventor Paul N. Loewenstein, filed 2 Jan. 2014 and issued on 13 Oct. 2015 (referred to as "the '370 patent"), which is incorporated herein by reference.)

The schemes described in the '296 and '370 patents can be effectively used to perform device-level error correction. However, after the data is retrieved from the memory devices, the data needs to be protected while the data is being transmitted between the DIMM and the host. Because it is possible to retry this type of transmission, a simple error-detection code such as a cyclic redundancy check (CRC) suffices for soft (non-persistent) errors. However, we also need to guard against a bad connection (hereafter, referred to as a "bad pin") between the DIMM and the host.

To allow data to be read in the presence of a bad pin, we need a "pin-correcting ECC." Note that for a typical DDR4 device, the number of data pins is 72 and the number of bits transferred per pin per memory operation is eight. Although the '296 scheme still works with r=8 and c=72, the code is much less robust than for r=32 and c=18.

Although a chip-correcting ECC also provides for pin correction, an ECC specifically for pin correction may use fewer check bits thus leaving some or more bits for additional data (herein referred to as "metadata").

Hence, what is needed is a method and an apparatus for providing a pin-correcting ECC without the shortcomings of existing techniques.

SUMMARY

The disclosed embodiments provide a memory system that provides error detection and correction. Each block of data in the memory system includes an array of bits logically organized into R rows and C columns, including C−M−1 data-bit columns containing data bits, a row check bit column including row-parity bits for each of the R rows in the block, and M inner check bit columns that collectively include MR inner check bits. (Note that M does not necessarily have to be an integer. For example, in one embodiment, using a degree-24 polynomial for an ECC scheme with 16 rows results in M=1½.) These inner check bits are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is associated with a different pin in a memory module interface, and wherein the check bits are generated from the data bits to facilitate block-level detection and correction for errors that arise during the transmission. During operation, the system transmits a block of data from the memory. Next, the system uses an error-detection circuit to examine the block of data, and determine whether an error has occurred during the transmission based on the examination.

In some embodiments, while examining the block of data, the system first reads the block of data, which includes the data-bit columns, the row check bit column and the M inner check bit columns. The system then uses the data bits in the data-bit columns and the check bits in the inner check-bit columns to regenerate the row-parity bits for the row check bit column and the inner check bits for the M inner check bit columns. Next, the system computes a row syndrome by exclusive-ORing the regenerated row-parity bits with the existing row-parity bits, and also computes an inner syndrome by exclusive-ORing the regenerated inner check bits with the existing inner check bits. Finally, the system determines whether the transmission generated an error based on the row syndrome and the inner syndrome.

In some embodiments, while determining whether the transmission generated an error, the system determines whether both the row syndrome and inner syndrome are zero. If both the row syndrome and inner syndrome are zero, the system determines that no error has occurred during the transmission. On the other hand, if either of the row syndrome and inner syndrome is non-zero, the system determines whether the row syndrome modulo P is zero. If the row syndrome modulo P is zero, the system determines that an uncorrectable error has occurred. If the row syndrome modulo P is non-zero, the system attempts to use the row syndrome, inner syndrome and column keys to identify a column in the block of data with an error by matching the inner syndrome with a calculated inner syndrome for each column. If a column cannot be identified, the system determines that an uncorrectable error has occurred. If a column is identified, the system determines that an error has occurred in the identified column.

In some embodiments, while matching the inner syndrome with a calculated inner syndrome for each column, the system performs multiplication operations in Res(P) between the row syndrome and each key in the set of keys. Next, the system compares the inner syndrome against results of the multiplication operations. If the inner syndrome matches a result, the system determines that the key associated with the result is the key for an erroneous column in which the error occurred.

In some embodiments the system includes an error-handling circuit. After an erroneous column is identified, this error-handling circuit: (1) uses the row syndrome to identify erroneous bits in the erroneous column; (2) flips the identified erroneous bits to produce a corrected column; and (3) after the corrected column is produced, regenerates the inner check bits for the block of data including the corrected column.

In some embodiments, after the corrected column is produced, the error-handling circuit compares the regenerated inner check bits for the block of data including the corrected column with existing inner check bits. If the comparison indicates that there remains an apparent double-bit error wherein both erroneous bits are in the same row and one is in the erroneous column, the error-handling circuit flips the erroneous bits to correct the apparent double-bit error.

In some embodiments, the check vectors are derived from a set of keys that are unique elements of Res(P), wherein each key is associated with a different column of the data block, and wherein the check vector for a row r of a column c is the product in Res(P) of the key for the column c and $\alpha^r$, wherein $\alpha$ is an element of Res(P).

In some embodiments, $CV(x, y)$ is the check vector associated with the bit at row x and column y of the array, and the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

In some embodiments, a key associated with a column $c_y$ is denoted as $key(c_y)$, and wherein the set of keys are selected so that for any row r, and for any three distinct columns $c_1$, $c_2$ and $c_3$, $key(c_1)$ XOR $key(c_2)$ is not equal to the product in Res(P) of $key(c_1)$ XOR $key(c_3)$ and $\alpha^r$.

In an exemplary embodiment, C=72, R=8 and M=3, and each column in the block of data is associated with a specific pin in a 72-pin memory-module interface. This 72-pin memory-module interface includes 64 pins for the data-bit columns, 1 pin for the row-parity bit column, 3 pins for the inner check bit columns, and 4 pins for other metadata.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Extensions to Previous Patents and Applications

This disclosure extends the work done in the '296 patent and the '370 (cited above), and also the following patent applications, which are incorporated by reference herein to provide implementation details: U.S. Pat. No. 8,335,961, entitled "Facilitating Probabilistic Error Detection and Correction After a Memory Component Failure," filed Jun. 30, 2009 and issued Dec. 18, 2012, by inventors Robert E. Cypher and Bharat K. Daga (referred to as the '961 patent); U.S. patent application Ser. No. 12/782,580, entitled "Memory System that Supports Probabilistic Component-Failure Correction with Partial Component Sparing," filed May 18, 2010, by inventors Bharat K. Daga and Robert E. Cypher (referred to as the '580 application); U.S. Pat. No. 8,335,976, entitled "Memory System that Provides Guaranteed Component Failure Correction with Double Error Correction," filed May 24, 2010 and issued Dec. 18, 2012, by inventors Robert E. Cypher and Bharat K. Daga (referred to as the '976 patent); and U.S. patent application Ser. No. 13/565,430, entitled "Using a Data ECC to Detect Address Corruption," filed Aug. 2, 2012, by inventor Paul N. Loewenstein (referred to as the '430 application).

Before describing implementation details, we first discuss specific aspects of Galois fields and reducible polynomials.

Implementing Galois Field Arithmetic

Galois fields all have the size of a power of a prime number. A Galois field of size $p^n$ is denoted as $GF(p^n)$. The prime number p is the characteristic of the field. Most implementations are of Galois fields of characteristic 2, because these are particularly suited to binary digital circuits. A Galois field of prime size is isomorphic to integer arithmetic modulo that prime. $GF(p^n)$ can be constructed as operations on polynomials over GF(p) modulo a degree n irreducible polynomial with coefficients $\in GF(p)$.

All non-zero elements of the field can be described as powers of a primitive element $\alpha \in GF(p^n)$. It is convenient but not required to use a primitive polynomial for the modulus. A primitive polynomial modulus conveniently allows $\alpha$ to be represented as the degree-1 polynomial x+0. Regardless of the polynomial chosen for the modulus, all representations of a Galois field of a given size are isomorphic to each other. It is this property that allows a Galois field of size q to be unambiguously denoted as GF(q). Note that a GF(2) polynomial be represented as $a_n x^n + a_{n-1} x^{n-1} \ldots a_1 x^1 + a_0$.

Key and Check Vector Generation

As in the '296 patent, we arrange the check bits with the data to be protected as an array with R rows and C columns. (See '296 patent, FIG. 3.) (Please note that the '296 patent uses the variable label N to represent the number of columns, whereas the present disclosure, the '961 patent, the '976 patent, the '580 application and the '430 application use the variable label C to represent the number of columns.)

Let P be a reducible polynomial over GF(2) of degree R with the coefficient $a_0=1$. Some embodiments use check vectors of the form $x^k$ mod P. It should be noted that no check vector (viewed as a GF(2) polynomial) shares a common factor k with P, because x shares no common factor with P. A typical embodiment has $k=r+R(c-1)$, where r is the row number and c is the column number shown in the '296 patent, FIG. 4.

Identifying a with the polynomial x+0, the check vectors for r=0 correspond to the column keys in the '296 patent, except that because P is reducible, the keys and check vectors cannot be regarded as elements of a Galois field.

It should be noted that the check vector generation scheme is the same check vector generation process as is used for a cyclic redundancy code (CRC) over columns 1 through C−1, using P as the generating polynomial.

Check Bit and Syndrome Generation

The row check bits are calculated as in the '296 patent. Moreover, the column check bits are calculated as in the '296 patent, using the check vectors calculated above. Also, the row syndrome is calculated as in the '296 patent. The inner syndrome is similarly calculated as in the '296 patent.

Single Component Error Correction

Because the syndromes and column keys are not elements of a Galois field, division is not in general defined. We cannot, therefore, divide the inner syndrome (modulo P) by the row syndrome to determine the column key of the component in error. However, multiplication is defined (it is polynomial multiplication modulo P). We can, therefore, multiply each column key by the row syndrome and compare the result with the inner syndrome.

Because P is reducible, however, an inappropriate choice of P can lead to multiple column key-row syndrome products matching the inner syndrome. This would make it impossible to correct a single-component error. With row syndrome $S_r$, there can be ambiguity between columns x and y with column keys $k_x$ and $k_y$ respectively if:

$$k_x \times_P S_r = k_y \times_P S_r$$

where $\times_P$ denotes GF(2) polynomial multiplication modulo P. Using the distributive law, we get:

$$(k_x - k_y) \times_P S_r = 0,$$

which holds if $(k_x - k_y) \times S_r$ is divisible by P, where x denotes GF(2) polynomial multiplication. This can only be true if either:

1. $S_r$ is divisible by P, or
2. $k_x - k_y$ has a factor in common with P.

Condition 1 implies that the degree of P is less than R. This cannot be true if the number of inner check bits is greater than the number of rows (i.e., the inner check bits occupy more than one column.) That the polynomial is reducible or irreducible makes no difference.

Condition 2 is avoidable by careful choice of P. We select P such that no $k_x - k_y$ shares a common factor with P. For embodiments with $2^r$ rows and 18 columns and using check vectors derived as for the typical embodiment above, the forbidden factors of P are: 0x3, 0x7, 0xb, 0xd, 0x13, 0x19, 0x1f, 0x49, 0x7ff and 0x1fff (representing polynomials as binary numbers as described earlier). These factors are independent of the number of rows provided that the column keys for column c (c>0) are of the form $x^{(c-1)2^S}$ mod P, where $2^S \geq R$.

Multi-Bit Detection and Correction Across Components

Double-Error Detection

Two Errors in the Same Row

This gives a zero row syndrome, so it cannot be confused with a single-chip error. Because all check vectors are different, the sum (exclusive-OR) of two check vectors cannot be zero, so double errors are detected.

Two Errors in Different Rows

We need to ensure that two errors in different columns and different rows never give the same inner syndrome as two errors in the same column (so it cannot be confused with a correctable error in a single component). There are two cases that do not correspond to single-component errors.

(1) One Error is in the Row Check Bit Column.

This results in the inner syndrome having the value of the check vector of the other bit in error. If the Hamming distance of the code defined by the generating polynomial is at least 4, then this cannot correspond to any double-bit error; otherwise, triple errors would not be detected as implied by a Hamming distance of 4. Note that this Hamming distance is sufficient but not necessary, because the double error it should not be confused with is constrained to a single column and the same rows.

(2) Neither Error is in the Row Check Bit Column.

If the Hamming distance of the code defined by the generating polynomial is at least 5, then this cannot correspond to a single-component double error, because then the code would not detect quad errors as implied by the Hamming distance. Note that this Hamming distance is sufficient but not necessary, because the double error with which it should not be confused is constrained to a single column and the same rows.

Double-Error Correction

In addition to not confusing the double error with a double error in a single column, we should also not confuse the error with another double error (so that the double errors can be distinguished for correction).

It should be noted that in systems where avoidance of data corruption is paramount, such as in computer memories, if errors are sufficiently common as to warrant double-error correction across components, then it is likely that the code needs to be sufficiently robust to detect triple errors across components.

Two Errors in the Same Row

There are two cases.

(1) One Error is in the Row Check Bit Column.

In this case we should not confuse the error with another double error in the same row. Because the check vectors are all different, we cannot confuse it with another double error with one of the bits in the row check bit column. With a Hamming distance of at least 4, we cannot confuse it with another double error in the same row. Note that this Hamming distance is sufficient but not necessary, because the double error with which it should not be confused is constrained to the same rows by the row syndrome.

(2) Neither Error is in the Row Check Bit Column.

With a Hamming distance of 4, we have already seen that we cannot confuse this with a double error where one of the errors is in the row check bit column. With a Hamming distance of 5, it cannot be confused with any other double error. Note that this Hamming distance is sufficient but not necessary, because the double error it should not be confused with is constrained to the same rows by the row syndrome.

Two Errors in Different Rows

There are two cases that do not correspond to single-component errors.

(1) One Error is in the Row Check Bit Column.

This results in the inner syndrome having the value of the check vector of the other bit in error. If the Hamming distance of the code defined by the generating polynomial is at least 4, then this cannot correspond to any double-bit error; otherwise, triple errors would not be detected as implied by a Hamming distance of 4. Note that this Hamming distance is sufficient but not necessary, because the double error it should not be confused with is constrained to the same rows by the row syndrome.

(2) Neither Error is in the Row Check Bit Column.

If the Hamming distance of the code defined by the generating polynomial is at least 5, then this cannot correspond to any other double error, because then the code would not detect quad errors as implied by the Hamming distance. Note that this Hamming distance is sufficient but not necessary, because the double error it should not be confused with is constrained to the same rows by the row syndrome.

Triple-Error Detection

Whether there is an odd or even number of errors can be unambiguously determined from the row syndrome. So there is no possibility of confusing triple errors with double errors.

Three Errors in the Same Row

All these cases have a single bit set in the row syndrome, and so should not be confused with single-bit errors. There are two cases:

(1) One Error in the Row Check Bit Column.

This gives an inner syndrome that corresponds to a double error. A Hamming distance of 4 is sufficient to distinguish this double error from a single correctable error.

(2) No Error in the Row Check Bit Column.

This gives an inner syndrome that corresponds to a triple error. A Hamming distance of 5 is sufficient to distinguish this double error single correctable error.

Two Errors in the Same Row

These errors involve two different rows: a row with a single error (the singleton row) and a row with a double error (the pair row). All these cases have a single bit set in the row syndrome, and so should not be confused with single-bit errors. There are four cases:

(1) Two Errors in the Row Check Bit Column.

The row syndrome has a single 1 in the singleton row. This results in a single-error inner syndrome, for an error in the pair row. A Hamming distance of 3 is sufficient for this not to be confused with a single-bit error in the singleton row.

(2) The Singleton Row Error in the Row Check Bit Column.

This results in a double-error inner syndrome for the pair row. A Hamming distance of 4 is sufficient for this not to be confused with a single bit error in the singleton row.

(3) A Pair Row Error in the Row Check Bit Column.

This results in a double-error inner syndrome. A Hamming distance of 4 is sufficient for this not to be confused with a single error in the pair row.

(4) No Error in the Row Check Bit Column.

A Hamming distance of 5 is sufficient for this case.

All Three Errors in Different Rows

These errors are distinguished by 3 bits set in the row syndrome. They should, therefore, not be confused with single-component correctable triple errors.

(1) Two Errors in Row Check Bit Column.

This results in a single-error inner syndrome, for an error in the pair row. A Hamming distance of 5 is sufficient for this not to be confused with a triple-bit error in a single component.

(2) One Error in Row Check Bit Column.

This results in a double-error inner syndrome, for an error in the pair row. A Hamming distance of 6 is sufficient for this not to be confused with a triple-bit error in a single component.

(3) No Error in Row Check Bit Column.

This results in a triple-error inner syndrome, for an error in the pair row. A Hamming distance of 7 is sufficient for this not to be confused with a triple-bit error in a single component.

Choice of Generating Polynomial

Allowing reducible as well as irreducible generating polynomials provides a wider choice of polynomial. In particular, it allows the choosing of polynomials that generate codes with a guaranteed minimum Hamming distance, such as those that generate Bose Ray-Chaudhuri Hocquenghem (BCH) codes.

As an example, let us assume 18 columns and 32 rows; after subtracting the row check bit column, this leaves $17 \times 32 = 544$ bits to be covered by the column check bits. The next power of 2 greater than 544 is $1024 = 2^{10}$. Using known techniques, we can construct a BCH code of Hamming distance 7 using a generating polynomial that is a product of 3 (suitably selected) degree-10 irreducible polynomials. However, for guaranteed single-column error correction, we need 32 column check bits, so we need to introduce an additional degree-2 polynomial as a factor. There is only one irreducible degree-2 GF(2) polynomial: $x^2+x+1$ (represented as 0x7). We should ensure that we choose column keys such that no $k_i - k_j$ is divisible by 0x7. However, this is not possible, because $x^n + 1$ is divisible by $x^2 + x + 1$ for all n divisible by 3. It is not possible to have a set of more than 3 different n where the differences between the n are all indivisible by 3. We are, therefore, limited to 30 column check bits, which could be used in a probabilistic component error correction as in the '580 application. As shown above, such a code has guaranteed triple-error detection and can also support double-error correction or detection.

It should again be emphasized that codes with lesser Hamming distances may allow triple-error detection and double-error correction or detection. However, these codes may need to be checked for these properties explicitly by searching through the error cases rather than having these properties guaranteed by construction. A 32-bit polynomial could be constructed as a product of 2 16-bit polynomials. A BCH code constructed this way guarantees a Hamming distance of 5. Thus, only the last two triple-error cases above need to be checked explicitly when using such a polynomial.

Syndrome Calculation and Decoding

Next, we discuss how syndromes are calculated and decoded. The row syndrome $S_r$ is calculated by XORing (GF(2) addition) the received row check bits with row check bits recalculated from the other received columns. Moreover, the inner syndrome $S_i$ is calculated by XORing (GF(2) addition) the received inner check bits and check bits recalculated from the received data bits. In the following discussion, let $k_c$ be the column key for column c.

No Known Failed Component

We first cover the situation where there is no known failed component. In this case, if $S_r=0$ and $S_i=0$, then we have no error. Otherwise, if for some column c, $S_r \times_P k_c = S_i$, then we have a correctable error in component c, which can be corrected by exclusive-ORing column c with $S_r$. Otherwise (if we find no such column), we have an uncorrectable error.

Known Failed Component

We next cover the case where there exists a known failed component. In this case, let F be the column index of the known failed component and let $\alpha$ be the polynomial x+0. If $S_r=0$ and $S_i=0$, then we have no error. Otherwise, if there is an error, we attempt to correct the error by exclusive-ORing column F with $S_r$. Note that this also works for the no error case, should we not wish to check. If $((S_r \bmod P) \times_P k_c) = S_i$, then the correction was successful.

Otherwise, if for some row r and column c:

$$\alpha^r \times_P (k_r + k_F) = ((S_r \bmod P) \times_P k_F) + S_i$$

then we have a single-bit error in row r and column c. To correct this, we invert the bits corresponding to column c and column F in row r. Otherwise, we have an uncorrectable error. Note that this determination is equivalent to recalculating the inner syndrome after XORing the row syndrome with the received bits in failed component column, and then determining if that syndrome is compatible with a double-bit error confined to one row and with one of the bits being in the failed component column.

This ability to correct an additional single-bit error depends on single-row, double-hit errors all having distinct inner syndromes. The inner syndrome code having a Hamming distance of 5 is sufficient but not necessary for this to hold. With an inner syndrome code Hamming distance of 7, no double-bit error can be confused with a single-bit error, and we also have double-error detection. Again, the Hamming distance is sufficient, but not necessary.

Implementation Details

We next describe implementation details for a system that facilitates error detection and correction using a reducible polynomial with GF(2) coefficients. One embodiment provides a mechanism for detecting and probabilistically correcting with very high probability multi-bit errors within a single memory component, caused for example by the failure of a communication or memory component (such as the failure of a DRAM chip). Moreover, when it cannot correct a component error, it is able to determine that it cannot perform the correction (thus, it never causes data corruption due to a failed attempt to correct a component error). In addition, once a failed component has been identified, it subsequently corrects all errors in the given component, plus any single-bit error in any other component.

The ability to correct single-bit errors in addition to the errors in the failed component is advantageous because it facilitates: (1) the correction of latent single-bit errors after a DRAM chip failure occurs; and (2) continued operation with a failed DRAM chip while providing SEC without remapping the data. Finally, the code is very efficient in terms of the number of check bits required. For example, if 18×8 DRAM chips with a burst length of 4 are used to store a 64B cache line plus 12 bits of metadata, the code can be used to provide a probability of approximately $(1\frac{1}{2}^{20})$ of correcting a random multi-bit error within a memory chip, such as could be caused by chip failure.

In one embodiment, the memory system accesses blocks of data (e.g., cache lines). Each of these blocks is logically organized into C sets of R bits each, which are viewed as forming an array with R rows and C columns, such that the bits affected by errors within a single component are located in a single column. For example, if 576 bits are stored on 18 DRAM chips, with 32 bits per DRAM, the bits can be viewed as forming a 32×18 array, wherein the bits stored on a single DRAM comprise a single column of the array. In this example, the rows are numbered 0 through R−1 and the columns are numbered 0 through C−1.

Figure 2A:
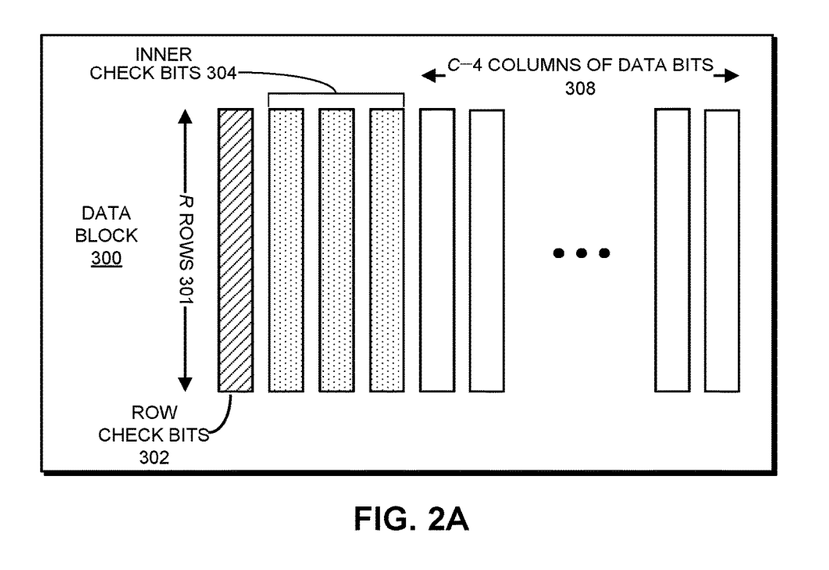
FIG. 2A illustrates a data block with multiple rows of inner check bits in accordance with the disclosed embodiments.

Column 0 and column 1 include check bits. More specifically, column 0 contains "row-parity check bits" 202, wherein the row-parity check bit stored in position (r, 0) is the even parity of the bits stored in position (r, c), where $1 \leq c \leq C-1$. Column 1 contains $X \leq R$ inner check bits 204 and R−X spare data bits 206. The X inner check bits 204 are used for component error correction with a probability of $(1-2^{-X})/(1-2^{-R})$ for a uniformly random error pattern within the component. It should be noted that most soft errors and errors caused by many component failure modes (such as pin failure) are by no means uniformly random, and can be guaranteed to be corrected even for X<R.

Associated with each column c, $0 \leq c \leq C-1$, is a unique key, $key_c$, which is an element of Res(P), a residue system comprising a set of polynomials with GF(2) coefficients modulo a polynomial P with GF(2) coefficients. Moreover, each inner check bit is the even parity of a subset of the R*C bits in a block. Specifically, the bit in location (r, c) is in the subset of bits covered by inner check bit i, $0 \leq i \leq X-1$, if bit i of $(key_c * \alpha^r)=1$, where the multiplication is in Res(P) and $\alpha$ is an element of Res(P). Correction of component errors can be accomplished by guessing (in parallel) that each column contains the error, calculating the inner syndrome that results from that guess, and checking the calculated inner syndrome against the true inner syndrome.

In addition, once a failed component has been identified, SCC (single-component correction) can be performed to correct arbitrary errors generated by the previously identified failed component. At this point, if there was a single-bit error in the original data (in addition to the component errors), there is now a double-bit error where both bits in error are in the same row and one is in the column corresponding to the failed component. (Note that this second error is "projected" into the failed component by the attempt to correct the failed component.) Next, the system calculates the inner syndrome of the resulting data and, if it is nonzero, corrects these remaining two errors by flipping those bits that yield this unique nonzero inner syndrome (assuming the given failed component).

To enable SEC with an identified failed component $c_f$, $0 \leq c_f \leq C-1$, it is necessary to guarantee that for each $r_1$, $0 \leq r_1 \leq R-1$, and $c_1$, $0 \leq c_1 \leq C-1$, inner_syndrome$(r_1, c_1)$ XOR inner_syndrome$(r_1, c_f)$ is unique for $c_1 \neq c_f$ (and, thus, the inner syndrome can be used for SEC). If either $c_1=0$ or $c_f=0$, then this is true if the Hamming distance of the code generating the inner syndrome is at least 3. If neither $c_1=0$ nor $c_f=0$, then a Hamming distance of 5 suffices for guaranteeing this property. Note that these Hamming distances are sufficient but not necessary.

Note that inner check bit i, $0 \leq i \leq X-1$, can be stored in location (i, 1) by selecting $key_1=1$. The selection of unique keys guarantees that all single-bit errors will have a unique syndrome and thus can be corrected. Also, note that by selecting $key_0=0$, the inner check bits do not cover the row check bits; thus, there is no circularity in their definition.

In the above analysis, it was assumed that the inner syndrome is a random member of Res(P). Note that many likely errors, such as errors caused by failure of a single pin of the component, may be guaranteed to produce a nonzero inner syndrome. Finally, note that once errors encountered by one or more memory accesses trigger a determination that a component has failed, subsequent memory accesses can use the known failed component ID to guarantee correction of further errors on that component.

The above-described technique is described in more detail below, but first we describe an exemplary computer system.

Computer System

Figure 1:
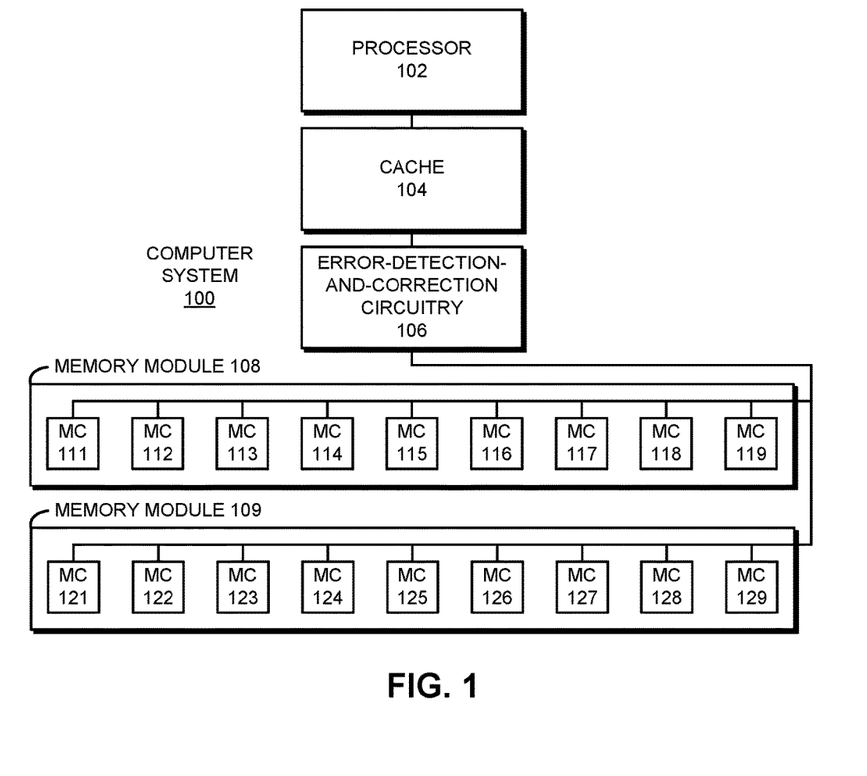
FIG. 1 illustrates a computer system in accordance with the disclosed embodiments.

FIG. 1 illustrates a computer system 100 in accordance with the described embodiments. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error-correction and error-detection operations for blocks of data which are retrieved from memory modules 108-109 and which are stored in cache memory 104. Note that the error-correction and error-detection operations can additionally (or alternatively) be performed when blocks of data in cache memory 104 are accessed by processor 102 from cache memory 104. One embodiment of error-detection-and-correction circuitry 106 is described in the '296 patent.

Memory modules 108 and 109 include memory components, which can be semiconductor chips containing random-access memory. More specifically, memory module 108 includes memory components (MCs) 111-119 and memory module 109 includes MCs 121-129.

Detecting and Correcting Errors in a Block of Data

Figure 2B:
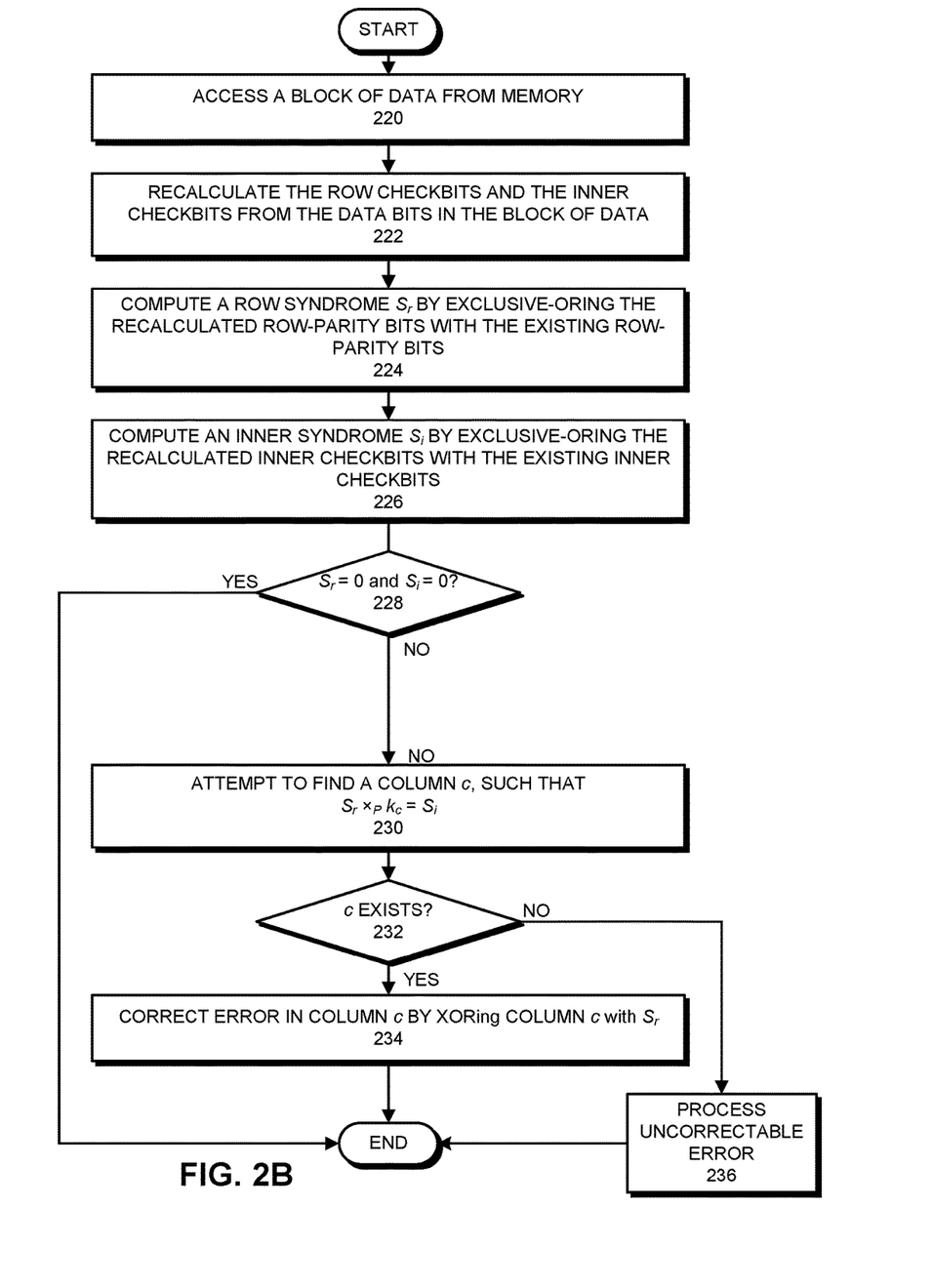
FIG. 2B presents a flow chart illustrating how an error generated by a memory component is detected in accordance with the disclosed embodiments.

FIG. 2B presents a flow chart illustrating how an error in a memory component can be detected and possibly corrected in accordance with the disclosed embodiments. At the start of the process, the system accesses a block of data from the memory (step 220). Next, the system examines the block of data to determine whether there is an error originating from a memory component. This determination involves a number of operations. First, the system recalculates the row-parity bits and the inner check bits from the data bits in the block of data (step 222). Next, the system computes a row syndrome $S_r$ by exclusive-ORing the recalculated row-parity bits with the existing row-parity bits (step 224). The system also computes an inner syndrome $S_i$ by exclusive-ORing the recalculated inner check bits with the existing inner check bits (step 226).

Next, the system determines whether the row syndrome $S_r$ and inner syndrome $S_i$ are both zero (step 228). If so, there is no error and the process is complete.

Otherwise, the system attempts to find a column c, such that $(S_r \bmod P) \times_P k_c = S$ (step 230) and the system tests to see whether such a column c exists (step 232).

If no such column c exists, there exists an uncorrectable error in the data block and the system takes action to process the uncorrectable error (step 236). Otherwise, if such a column c does exist, we have a correctable error in component c, which is corrected by XORing column c with $S_r$ (step 234).

Handling Memory Component Failures and Additional Errors

Implementation details for techniques and associated circuitry for handling memory component failures and additional errors are described in the '296 patent, the '961 patent, the '580 application, the '976 patent, and the '430 application which have been incorporated by reference in this specification to provide these details.

Robust Pin-Correcting Error-Correcting Code

We now describe a robust pin-correcting ECC scheme, which is a modification of the schemes described in the '296 and '370 patents. These two patents each use "row check bits" and "inner check bits," wherein the row check bits occupy precisely one column, and the inner check bits occupy one column (or less for the "probabilistic" correction using a reducible polynomial described in the '370 patent).

The main modification is to allow the polynomial used for generating the inner check bits to be of a degree larger than the number of rows r. This means that the number of inner check bits is also greater than r and therefore the inner check bits occupy multiple columns as is illustrated in data block 300 in FIG. 2B. More specifically, data block 300 comprises an array with R rows 301 and C columns, wherein the row check bits 302 occupy 1 column, the data bits 308 occupy C-4 columns, and the inner check bits 304 occupy 3 columns. (Note that check bit columns do not necessarily have to occupy the first four columns of data block 300. In general, the check bit columns can occupy other columns in data block 300.) The ECC generation and decoding processes are otherwise unchanged from the '296 and '370 patents.

EXAMPLES

We now present examples of specific pin-correct encodings. Note that each pin in these examples maps to a specific column in the ECC scheme, and each unit interval (UI) maps to a row.

72-Pin, Burst Length 8

DDR4 DIMMs have 72 pins with the data transfer occurring over 8 UIs (burst length 8). A pin-correcting ECC can be implemented for data transmissions involving 72 pins with a burst length of 8 by using the degree-24 primitive polynomial $x^{24}+x^{11}+x^5+x^2+1$, wherein the inner check bits occupy 3 columns, and the row check bits occupy a single column, which means that 4 pins are used for check bits. The resulting code can detect all multi-device errors of up to 3 bits.

In principle, a degree-8 polynomial suffices for bad pin detection for DDR4. However, while there are only 255 possible non-zero eight-bit check-vectors, there are 71×8=568 bits covered by the inner check bits. Hence, some check-vectors are necessarily repeated. Any double-bit error in locations with identical check-vectors appears to be a double-bit error in column 0, thus causing a false correction and consequent data corruption. For example, using any primitive degree-8 polynomial results in a double-bit error in row 1, column 1 and row 0, column 33 being indistinguishable from an error in rows 0 and 1 of column 0.

Using a degree-16 polynomial requires an extra column of check bits. However, even a degree-16 polynomial using the primitive polynomial can generate codes that are prone to miscorrection upon double-bit errors. For example, using the primitive polynomial $x^{16}+x^5+x^3+x^2+1$, errors in row 0 of column 1 and row 5 of column 61 are indistinguishable from errors in rows 0 and 5 of column 9.

Finally, the degree-24 primitive polynomial $x^{24}+x^{11}+x^5+x^2+1$ generates a code that is robust against all multi-column double and triple errors. However, not all degree-24 primitive polynomials are suitable. For example the degree-24 polynomial $x^{24}+x^4+x^3+x+1$ generates a code that is prone to miscorrection of triple errors across columns. In particular, errors in row 2 of column 0, row 0 of column 1 and row 6 of column 1 are indistinguishable from errors in rows 0, 2 and 6 of column 7.

Of note is a class of degree-30 reducible polynomials that are multiples of three suitable degree-1.0 polynomials generating BCH codes with Hamming distance 7. The codes generated by each of these degree-30 polynomials are robust against double and triple errors (see the '370 patent). However, the chosen reducible polynomial must not have 0x7ff, 0x623 or 0x4a9 as a factor (using hexadecimal polynomial notation for brevity) assuming the non-zero column keys are of the form $x^{8n}$ (See condition 2 in column 4 of the '370 patent.)

40-Pin, Burst Length 16

The minimum degree polynomial is 16 for pin-correction with a burst length of 16. However, the resulting code can be very weak. For example, using the primitive polynomial $x^{16}+x^5+x^3+x^2+1$, a double error in row 0 of column 1, and row 5 of column 31 is indistinguishable from a double error in rows 0 and 5 of column 5.

The degree-24 primitive polynomial $x^{24}+x^{11}+x^5+x^2+1$ generates a code that is robust against all multi-column double and triple errors. Moreover, the degree-24 reducible polynomial $x^{24}+x^{19}+x^{14}+x^{13}+x^8+x^6+x^5+x^2+1$ also generates a code that is robust against all multi-column double and triple errors.

Finally, the same BCH-code-generating degree-30 polynomials of the previous section also work for 40-pin, burst length 16, provided the non-zero column keys are of the form $x^{16n}$.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A memory system that provides error detection and correction via robust pin-correcting error-correcting code, comprising:
   a transmission mechanism configured to transmit a block of data in the memory system, wherein each block of data in the memory system includes an array of bits logically organized into R rows and C columns, including C−M−1 data-bit columns containing data bits, a row check bit column including row-parity bits for each of the R rows in the block, and M inner check bit columns that collectively include MR inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is associated with a different pin in a memory module interface, and wherein the check bits are generated from the data bits to facilitate block-level detection and correction for errors that arise during the transmission; and
   an error-detection circuit configured to,
      examine a block of data that was transmitted by the transmission mechanism, and
      determine whether an error has occurred during the transmission based on the examination;
   wherein C >R, and wherein a plurality of pins is associated with metadata.

2. The memory system of claim 1, wherein while examining the block of data, the error-detection circuit is configured to:
   read the block of data, which includes the data-bit columns, the row check bit column and the M inner check bit columns;
   use the data bits in the data-bit columns and the checkbits in the inner check bit columns to regenerate the row-parity bits for the row check bit column and the inner check bits for the M inner check bit columns;
   compute a row syndrome by exclusive-ORing the regenerated row-parity bits with the existing row-parity bits;
   compute an inner syndrome by exclusive-ORing the regenerated inner check bits with the existing inner check bits; and
   determine whether the transmission generated an error based on the row syndrome and the inner syndrome.

3. The memory system of claim 2, wherein determining whether the transmission generated an error includes:
   determining whether both the row syndrome and inner syndrome are zero;
   if both the row syndrome and inner syndrome are zero, determining that no error has occurred during the transmission; and
   if either of the row syndrome and inner syndrome is non-zero, determining whether the row syndrome modulo P is zero;
      if the row syndrome modulo P is zero, determining that an uncorrectable error has occurred; and
      if the row syndrome modulo P is non-zero, attempting to use the row syndrome, inner syndrome and column keys to identify a column in the block of data with an error by matching the inner syndrome with a calculated inner syndrome for each column;
         if a column cannot be identified, determining that an uncorrectable error has occurred; and
         if a column is identified, determining that an error has occurred in the identified column.

4. The memory system of claim 3, wherein while matching the inner syndrome with a calculated inner syndrome for each column, the error-detection circuit is configured to:
   perform multiplication operations in Res(P) between the row syndrome and each key in the set of keys;
   compare the inner syndrome against results of the multiplication operations; and
   if the inner syndrome matches a result, determine that the key associated with the result is the key for an erroneous column in which the error occurred.

5. The memory system of claim 3, further comprising an error-handling circuit, wherein after an erroneous column is identified, the error-handling circuit is configured to:
   use the row syndrome to identify erroneous bits in the erroneous column;
   flip the identified erroneous bits to produce a corrected column; and after the corrected column is produced, regenerate the inner check bits for the block of data including the corrected column.

6. The memory system of claim 5, wherein after the corrected column is produced, the error-handling circuit is configured to:
compare the regenerated inner check bits for the block of data including the corrected column with existing inner check bits; and
if comparison indicates that there remains an apparent double-bit error wherein both erroneous bits are in the same row and one is in the erroneous column, flip the erroneous bits to correct the apparent double-bit error.

7. The memory system of claim 1, wherein the check vectors are derived from a set of keys that are unique elements of Res(P), wherein each key is associated with a different column of the data block, and wherein the check vector for a row r of a column c is the product in Res(P) of the key for the column c and $\alpha^r$, wherein $\alpha$ is an element of Res(P).

8. The memory system of claim 1, wherein CV(x, y) is the check vector associated with the bit at row x and column y of the array, and wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

9. The memory system of claim 1, wherein a key associated with a column $c_y$ is denoted as key($c_y$), and wherein the set of keys are selected so that for any row r, and for any three distinct columns $c_1$, $c_2$ and $c_3$, key($c_1$) XOR key($c_2$) is not equal to the product in Res(P) of key($c_1$) XOR key($c_3$) and $\alpha^r$.

10. The memory system of claim 1, wherein C=72, R=8 and M=3, and wherein each column in the block of data is associated with a specific pin in a 72-pin memory-module interface, which includes 64 pins for the data-bit columns, 1 pin for the row-parity bit column, 3 pins for the inner check bit columns, and 4 pins for other metadata.

11. A computer system with robust pin-correcting error-correcting code, comprising:
one or more processors;
a memory system including:
a transmission mechanism configured to transmit a block of data in the memory system, wherein each block of data in the memory system includes an array of bits logically organized into R rows and C columns, including C−M−1 data-bit columns containing data bits, a row check bit column including row-parity bits for each of the R rows in the block, and M inner check bit columns that collectively include MR inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is associated with a different pin in a memory module interface, and wherein the check bits are generated from the data bits to facilitate block-level detection and correction for errors that arise during the transmission; and
an error-detection circuit configured to,
examine a block of data that was transmitted by the transmission mechanism, and
determine whether an error has occurred during the transmission based on the examination;
wherein C >R, and wherein a plurality of pins is associated with metadata.

12. A method for providing error detection and correction via robust pin-correcting error-correcting code, comprising:
transmitting a block of data in a memory system, wherein each block of data in the memory system includes an array of bits logically organized into R rows and C columns, including C−M−1 data-bit columns containing data bits, a row check bit column including row-parity bits for each of the R rows in the block, and M inner check bit columns that collectively include MR inner check bits, which are defined to cover bits in the array in accordance with a set of check vectors, wherein each check vector is associated with a different bit in the array and is an element of Res(P), a residue system comprising a set of polynomials with GF(2) coefficients modulo a polynomial P with GF(2) coefficients, wherein each column is associated with a different pin in a memory module interface, and wherein the check bits are generated from the data bits to facilitate block-level detection and correction for errors that arise during the transmission; and
using an error-detection circuit to,
examine a block of data that was transmitted by the transmission mechanism, and
determine whether an error has occurred during the transmission based on the examination;
wherein C >R, and wherein a plurality of pins is associated with metadata.

13. The method of claim 12, wherein examining the block of data includes:
reading the block of data, which includes the data-bit columns, the row check bit column and the M inner check bit columns;
using the data bits in the data-bit columns and the check-bits in the inner check bit columns to regenerate the row-parity bits for the row check bit column and the inner check bits for the M inner check bit columns;
computing a row syndrome by exclusive-ORing the regenerated row-parity bits with the existing row-parity bits;
computing an inner syndrome by exclusive-ORing the regenerated inner check bits with the existing inner check bits; and
determining whether the transmission generated an error based on the row syndrome and the inner syndrome.

14. The method of claim 13, wherein determining whether the transmission generated an error includes:
determining whether both the row syndrome and inner syndrome are zero;
if both the row syndrome and inner syndrome are zero, determining that no error has occurred during the transmission; and
if either of the row syndrome and inner syndrome is non-zero, determining whether the row syndrome modulo P is zero;
if the row syndrome modulo P is zero, determining that an uncorrectable error has occurred; and
if the row syndrome modulo P is non-zero, attempting to use the row syndrome, inner syndrome and column keys to identify a column in the block of data with an error by matching the inner syndrome with a calculated inner syndrome for each column;
if a column cannot be identified, determining that an uncorrectable error has occurred; and
if a column is identified, determining that an error has occurred in the identified column.

15. The method of claim 14, wherein matching the inner syndrome with a calculated inner syndrome for each column includes:

performing multiplication operations in Res(P) between the row syndrome and each key in the set of keys;

comparing the inner syndrome against results of the multiplication operations; and if the inner syndrome matches a result, determining that the key associated with the result is the key for an erroneous column in which the error occurred.

16. The method of claim 14, wherein after an erroneous column is identified, the method further comprises:

using the row syndrome to identify erroneous bits in the erroneous column;

flipping the identified erroneous bits to produce a corrected column; and after the corrected column is produced, regenerating the inner check bits for the block of data including the corrected column.

17. The method of claim 16, wherein after the corrected column is produced, the method further comprises:

comparing the inner check bits for the block of data including the corrected column with the existing inner check bits; and if comparison indicates that there remains an apparent double-bit error wherein both erroneous bits are in the same row and one is in the column associated with the failed component, flipping the erroneous bits to correct the apparent double-bit error.

18. The method of claim 12, wherein the check vectors are derived from a set of keys that are unique elements of Res(P), wherein each key is associated with a different column of the data block, and wherein the check vector for a row r of a column c is the product in Res(P) of the key for the column c and $\alpha^r$, wherein $\alpha$ is an element of Res(P).

19. The method of claim 12, wherein CV(x, y) is the check vector associated with the bit at row x and column y of the array, and wherein the set of keys are selected so that for any two distinct rows $r_1$ and $r_2$ and any three distinct columns $c_1$, $c_2$, and $c_3$, CV($r_1$, $c_1$) XOR CV($r_2$, $c_2$) XOR CV($r_1$, $c_3$) XOR CV($r_2$, $c_3$) is not equal to zero.

20. The method of claim 1, wherein C=72, R=8 and M=3, and wherein each column in the block of data is associated with a specific pin in a 72-pin memory-module interface, which includes 64 pins for the data-bit columns, a pin for the row-parity bit column, 3 pins for the inner check bit columns, and 4 pins for other metadata.

* * * * *

UNITED STATES PATENT AND TRADEMARK OFFICE
CERTIFICATE OF CORRECTION

PATENT NO. : 10,423,482 B2
APPLICATION NO. : 15/458408
DATED : September 24, 2019
INVENTOR(S) : Paul N. Loewenstein Page 1 of 1

It is certified that error appears in the above-identified patent and that said Letters Patent is hereby corrected as shown below:

In the Specification

Summary section (at Column 7, Line 45), please delete the words "error single" and please insert the words --error from a single--

Summary section (at Column 9, Line 21), please delete the word "$k_r$" and please insert the word --$k_C$--

Summary section (at Column 9, Line 32), please delete the words "double-hit" and please insert the words --double-bit--

Summary section (at Column 9, Line 65), please delete the words "$(1 1/2^{20})$" and please insert the words --$(1-1/2^{20})$--

Summary section (at Column 11, Line 63), please delete the words "=S" and please insert the words --=$S_i$--

Summary section (at Column 13, Line 3), please delete the words "$+^{11}+$" and please insert the words --$+x^{11}+$--

Summary section (at Column 13, Line 26), please delete the words "column 1, and" and please insert the words --column 1 and--

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*